United States Patent
Mieno (10) Patent No.: US 8,105,920 B2
(45) Date of Patent: *Jan. 31, 2012

(54) SEMICONDUCTOR DEVICE WITH AMORPHOUS SILICON MAS MEMORY CELL STRUCTURE AND MANUFACTURING METHOD THEREOF

(75) Inventor: Fumitake Mieno, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 322 days.

This patent is subject to a terminal disclaimer.

(21) Appl. No.: 12/259,015

(22) Filed: Oct. 27, 2008

(65) Prior Publication Data
US 2010/0001271 A1    Jan. 7, 2010

(30) Foreign Application Priority Data
Jul. 2, 2008    (CN) ............... 2008 1 0040287

(51) Int. Cl.
*H01L 21/00*    (2006.01)
(52) U.S. Cl. ................ 438/482; 257/E21.002

(58) Field of Classification Search ............ 257/49, 257/52, 57, 61, 66, 67, E21.001, E21.002; 438/142, 197, 478, 482–487, 584, 585, 592, 438/593, 594
See application file for complete search history.

(56) References Cited

U.S. PATENT DOCUMENTS
2010/0001270 A1 * 1/2010 Mieno .................... 257/57
* cited by examiner

*Primary Examiner* — Ha Tran T Nguyen
*Assistant Examiner* — Kevin Quinto
(74) *Attorney, Agent, or Firm* — Kilpatrick Townsend & Stockton LLP (57) ABSTRACT

A semiconductor device with an amorphous silicon (a-Si) metal-aluminum oxide-semiconductor (MAS) memory cell structure. The device includes a substrate, a dielectric layer overlying the substrate, and one or more source or drain regions embedded in the dielectric layer with a co-planar surface of n-type a-Si and the dielectric layer. Additionally, the device includes a p-i-n a-Si diode junction. The device further includes an aluminum oxide charge trapping layer on the a-Si p-i-n diode junction and a metal control gate overlying the aluminum oxide layer. A method is provided for making the a-Si MAS memory cell structure and can be repeated to integrate the structure three-dimensionally.

19 Claims, 6 Drawing Sheets

SEMICONDUCTOR DEVICE WITH AMORPHOUS SILICON MAS MEMORY CELL STRUCTURE AND MANUFACTURING METHOD THEREOF

CROSS-REFERENCE TO RELATED APPLICATIONS

This application claims priority to Chinese Patent Application No. 200810040287.5, filed Jul. 2, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a semiconductor device having a memory cell and a method for making the device. Merely by way of example, the invention has been applied to a three-dimensional (3D) amorphous silicon (a-Si) metal-aluminum oxide-semiconductor (MAS) memory cell structure and a method for the manufacture of the memory cell structure and 3D integration. But it would be recognized that the invention has a much broader range of applicability. For example, the invention can be applied to a variety of devices such as dynamic random access memory devices, static random access memory devices, Flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

Over the past, reducing memory devices have been a challenging task. As an example, for non-volatile memory devices the high density memory development is hindered by the inability to scale down the memory cell size without reducing the memory capacitance per unit area. In the past, various conventional techniques have been developed for memory cell structures with reduced dimensions. Unfortunately, these conventional techniques have often been inadequate.

Therefore, it is seen that an improved device design and technique for memory cell structures capable of three-dimensional integration is desired.

BRIEF SUMMARY OF THE INVENTION

The present invention is directed to integrated circuits and their processing for the manufacture of semiconductor devices. More particularly, the invention provides a semiconductor device having a memory cell and a method for making the device. Merely by way of example, the invention has been applied to a three-dimensional (3D) amorphous silicon (a-Si) metal-aluminum oxide-semiconductor (MAS) memory cell structure and a method for the manufacture of the memory cell structure and 3D integration. But it would be recognized that the invention has a much broader range of applicability. For example, the invention can be applied to a variety of devices such as dynamic random access memory devices, static random access memory devices, Flash memory devices, and others.

In a specific embodiment, the invention provides a device with a-Si MAS memory cell structure. The device includes a substrate, a dielectric layer on the substrate, and one or more source or drain regions being embedded in the dielectric layer. Each of the one or more source or drain regions includes an n-type a-Si layer, a diffusion barrier layer, and a conductive layer. The n-type a-Si layer, which has a co-planar surface with the dielectric layer, is located on the diffusion barrier layer. The diffusion barrier layer overlays the conductive layer. Additionally, the device includes an intrinsic type (i-type) a-Si layer overlying the co-planar surface of the n-type a-Si layer and the dielectric layer. Moreover, the device includes a p-type a-Si layer overlying the i-type a-Si layer. The device further includes an aluminum oxide layer on the p-type a-Si layer and at least one control gate overlying the aluminum oxide layer.

In an alternative specific embodiment, the invention provides a method for making an a-Si MAS memory cell structure. The method includes providing a substrate, forming a first insulation layer on the substrate, and forming one or more source or drain regions on the first insulation layer. Each of the one or more source or drain regions is associated with a first surface and includes an n-type a-Si layer, a barrier layer, and a conductive layer. The n-type a-Si layer is located on the barrier layer. The barrier layer overlays the conductive layer. Additionally, the method includes forming a second insulation layer on the first insulation layer. The second insulation layer is associated with a second surface which is substantially co-planar with the first surface. The method further includes forming an i-type a-Si layer overlying the first surface and the second surface and forming a p-type a-Si layer overlying the i-type a-Si layer. Moreover, the method includes forming an aluminum oxide layer on the p-type a-Si layer. The method further includes forming a metal layer overlying the aluminum oxide layer and forming at least one control gate by patterning the metal layer.

In yet another specific embodiment, the p-type a-Si overlying the i-type a-Si layer is capable of forming a p-i-n diode junction at the n-type a-Si surface. This p-i-n diode junction can act as an access device for each memory bit with improved signal-to-noise ratio and reduced scaling limitations. In yet another specific embodiment, the combination of n-type a-Si source region, p-type a-Si channel layer, and next n-type a-Si drain region is capable of forming a thin-film-transistor (TFT). The TFT can act as an alternative access device for the memory cell. Additionally, the simplicity of the cell structure design provides an ability to be integrated three-dimensionally. For example, the whole memory cell structure can be implemented in a cross-point memory architecture in which each memory cell structure, including aluminum oxide layer as a storage layer, can be sandwiched between an array of orthogonal word lines and bit lines.

Many benefits can be achieved by way of the present invention over conventional techniques. According to certain embodiments, the present invention combines the advantages of high reliability of high-k aluminum oxide layer for charge-trapping memory storage design and small geometric cell size using PIN diode as the access device. Particularly, the simple layered structure provides an excellent scaling properties for the memory devices. In addition, the present invention provides an easy to use process that is compatible with conventional CMOS process technology without substantial modifications to conventional equipment and processes. In some embodiments, the method provides a process to form a PIN diode junction by low-temperature deposition of a-Si films that meets the stackability and thermal budget constraint for 3D memory cell structure. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a semiconductor device having a memory cell and a method for making the device. Merely by way of example, the invention has been applied to a three-dimensional (3D) amorphous silicon (a-Si) metal-aluminum oxide-semiconductor (MAS) memory cell structure and a method for the manufacture of the memory cell structure and 3D integration. But it would be recognized that the invention has a much broader range of applicability. For example, the invention can be applied to a variety of devices such as dynamic random access memory devices, static random access memory devices, Flash memory devices, and others.

As discuss above, various conventional techniques have been directed to memory cells with reduced sizes. According to one of the conventional techniques, memory cells are implemented with stacked gate structure. For example, a stack structure is programmed using one or more channel hot-electrons that pass through a source region and a channel region and is then erased by a Fowler-Norheim tunneling effect.

Unfortunately, stacked gate cell structures, being of two-dimensional array type, usually have a smaller memory capacity per unit area as the cell size scales down. One feasible solution is to stack three-dimensionally several layers of memory arrays on top of a Si substrate containing the CMOS support circuitry. According to various embodiments, the present invention provides three dimensional memory cell structures. For example, certain embodiments of the present invention provides an ability to fabricate stackable access device in the memory cell. This brings up an requirement to improve the design of memory cell structure that can fulfill one or more of the following attributes including, stacking ability, small geometry, low leakage current, bi-directional operable, easy integration into a low temperature backend CMOS flow, cost effectiveness, efficiency, etc. Accordingly, various embodiments of the present invention provide an amorphous silicon metal-aluminum oxide-semiconductor (a-Si MAS) memory cell structure. It is to be understood that the term "a-Si MAS" refers to a class of amorphous silicon memory cell structures and is broadly defined. For example, an "a-Si MAS" may be illustrated according to FIG. 1.

Figure 1:
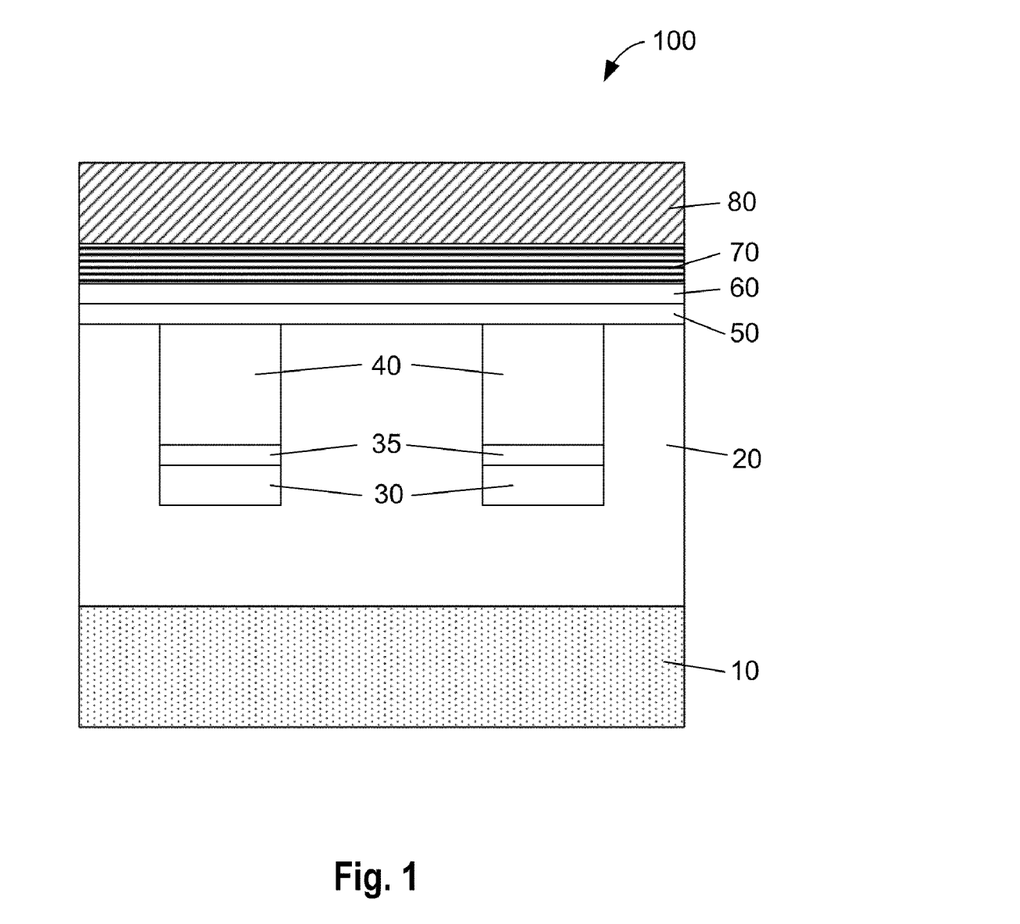
FIG. 1 is a simplified side-view diagram of an a-Si metal-aluminum oxide-semiconductor (a-Si MAS) memory cell according to an embodiment of the present invention.

FIG. 1 is a simplified diagram for a semiconductor device 100 having an a-Si MAS memory cell structure that is capable of being stacked three-dimensionally. This diagram is merely an example, which should not unduly limit the scope of the claims. One of ordinary skill in the art would recognize many variations, alternatives, and modifications. The device 100 includes following components:

1. Substrate 10;
2. Dielectric region 20;
3. Conductive layer 30;
4. Barrier layer 35;
5. n-type a-Si source or drain region 40;
6. i-type a-Si middle layer 50;
7. p-type a-Si layer 60;
8. Aluminum oxide layer 70; and
9. Metal gate region 80.

The example in FIG. 1 shows two column structures, each including a conductive layer 30, a diffusion barrier layer 35, and an a-Si source or drain region 40. In a specific embodiment, either of the s-Si regions 40 can be a source region or a drain region of a transistor. The current conduction in this transistor is provided by a channel region which is formed by the portion of the i-type a-Si middle layer 50 above and between the source and drain regions.

Although the above has been shown using a selected group of components for the device 100, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particular below.

In one embodiment, the substrate 10 is made of a semiconductor material. For example, the semiconductor material is silicon. In another example, the substrate 10 includes a plurality of semiconductor devices such as a-Si MAS memory arrays with dielectric passivation.

The dielectric region 20 is located on the substrate 10. In one embodiment, at least part of the dielectric region 20 consists of silicon dioxide formed through thermal oxidation process on a silicon substrate. In another embodiment, the dielectric layer 20 is silicon oxide deposited by high-density-plasma (HDP) assisted chemical vapor deposition or is TEOS deposited silicon oxide.

There are one or more confined regions embedded in the dielectric layer 20. Each of these confined region contains a conductive layer, a diffusion barrier layer, and a semiconductor source or drain region. In an exemplar confined region as shown in FIG. 1, the conductive layer 30 is located at the bottom and the diffusion barrier layer 35 overlays the conductive layer 30, followed by a n-type a-Si layer 40. The n-type a-Si layer 40 has a surface co-planar with the surface of the dielectric layer 20. The n-type a-Si layer 40 is capable of forming a source or drain region for the device 100. The n-type source or drain region 40 is conductively connected to the conductive layer 30 through the diffusion barrier layer 35. The conductive layer 30 is capable of coupling electrically with the memory bitlines (not shown in FIG. 1) to perform programming or erasing function for the memory cell. In one embodiment, the conductive layer 30 is a material containing metal or metal alloy material. For example, the material is titanium silicide. In another embodiment, the diffusion barrier layer 35 is titanium nitride.

Referring to FIG. 1, the n-type a-Si source or drain region 40 contains hydrogen-free amorphous silicon which is located at the top part within the confined region embedded in dielectric region 20. In one embodiment, the amorphous silicon is doped with n-type dopants (e.g., As, P, etc) to be conductive with electrons as its majority carrier. As seen in FIG. 1, in another embodiment, the n-type a-Si source or drain region 40 has a co-planar surface with the dielectric layer 20.

Referring again to FIG. 1, the i-type a-Si layer 50 is located on the co-planar surface of the n-type a-Si source or drain region 40 and the dielectric layer 20. The i-type a-Si layer 50 is an intrinsic semiconductor without impurity doping. In one embodiment, the i-type a-Si layer 50 is at least partially in direct contact with the n-type a-Si source or drain region 40. Additionally, the p-type a-Si layer 60 is located on the i-type a-Si layer 50. In one example, the p-type a-Si layer is doped with p-type dopants (e.g., B, Ga, etc) with holes as its majority carrier. Referring to FIG. 1, in another embodiment, p-type a-Si layer 60 and i-type a-Si layer 50 overlying the confined n-type a-Si source or drain region 40 form an a-Si p-i-n diode junction in the device 100. In yet another embodiment, the p-type a-Si layer 60 located over two neighboring n-type a-Si source or drain regions 40 is capable of forming a p-channel thin-film transistor (TFT). Either the a-Si p-i-n diode junction or p-channel TFT can be utilized as a memory access device for the device 100.

Referring to FIG. 1, the aluminum oxide layer 70 is located on the p-type a-Si layer 60. In one embodiment, the aluminum oxide layer 70 acts as the charge trapping dielectric, replacing standard dielectrics like silicon nitride. In another embodiment, the aluminum oxide layer 70 acts as blocking dielectric setting a large barrier height to reduce probability of the charge leaking into the gate region of the memory cell. For example, the use of an aluminum oxide blocking dielectric allows for a comparatively simple metal gate integration with reduced access time. In another embodiment, a dielectric barrier layer may be located between the p-type a-Si layer 60 and the aluminum oxide layer 70, playing a role as a tunnel barrier through which the hot carriers is injected from the drain region by the programming electric field in p-i-n junction. For example, the dielectric barrier layer can be silicon oxide. In certain embodiments, the charge trapping aluminum oxide layer 70 effectively reduces the total equivalent oxide thickness and offers a large design space for the tunnel barrier to meet certain device design requirements. For example, the thickness adjustment of the tunnel barrier and aluminum oxide layer 70 provides a good control of the retention time and programming/erasing characteristics for the device 100. In another example, the charge amount trapped in the high-k aluminum oxide layer may be fine tuned and controlled to store 4 or more bits per cell.

Referring to FIG. 1 again, the device 100 includes at least one metal gate region 80 as a control gate. The metal gate region 80 is formed by patterning a metal layer which is formed overlying the charge trapping aluminum oxide layer 70. The patterned metal gate region 80 is located at least over one confined n-type a-Si source or drain region 40 where a p-i-n a-Si diode junction is formed. The pattern geometry of the metal gate region 80 is not specifically shown in FIG. 1, which is merely an example and one of ordinary skill in the art would recognize many variations, alternatives, and modifications of the metal gate regions 80 as well as their interconnections. For example, the metal gate region 80 can be electrically coupled to the memory array wordlines (not shown) which may be orthogonal to the memory bitlines coupled to the conductive layer 30. In one embodiment, the metal gate region 80 as a control gate of the memory cell can be made of a material with high work function to suppress the parasitic gate erase current. In one example, the metal gate region 80 includes titanium material. In another example, the metal gate region 80 includes aluminum material. One of ordinary skill in the art would recognize many alternatives of the gate materials for various applications of the present invention.

According to an embodiment of the present invention, the device 100 with an a-Si MAS memory cell structure can be repeated laterally to form a memory array. The memory array further can be passivated with an inter-layer dielectrics with a plurality of metal interconnects and/or contacts to the gate, source or drain regions. In another embodiment, the passivation layer can be further planarized to form a substrate for stacking a plurality of the devices 100 again. In yet another embodiment, the present invention provides a-Si MAS memory cell structure that can be integrated in multiple layers to form a three-dimensional memory array.

Figure 2:
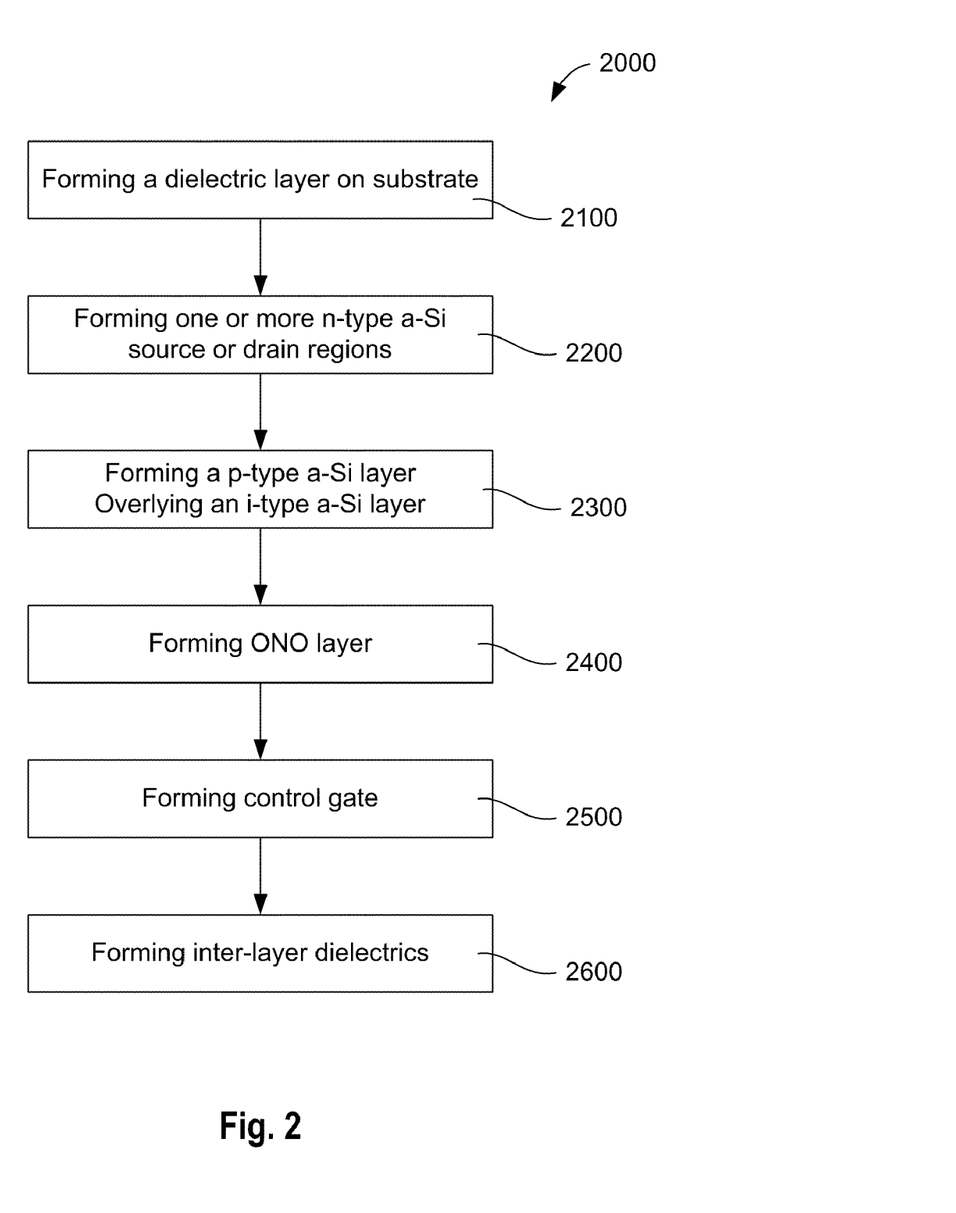
FIG. 2 is a simplified diagram showing a method of manufacturing a-Si MAS memory cell structure according to an embodiment of the present invention.

FIG. 2 is a simplified diagram showing a method for manufacturing a-Si MAS memory cell structure according to an embodiment of the present invention. This diagram is merely an example, which should not unduly limit the scope of the claims herein. The method 2000 includes the following processes:

1. Process 2100 for forming a dielectric layer on a substrate;
2. Process 2200 for forming n-type a-Si source/drain region;

3. Process 2300 for forming p-type a-Si layer overlying an i-type a-Si middle layer;

4. Process 2400 for forming aluminum oxide layer;

5. Process 2500 for forming metal gate; and

6. Process 2600 for forming inter-layer dielectrics.

The above sequence of processes provides a method according to an embodiment of the present invention. Other alternatives can also be provided where processes are added, one or more processes are removed, or one or more processes are provided in a different sequence without departing from the scope of the claims herein. For example, the semiconductor device having a-Si MAS memory cell structure made by the method 2000 is the device 100. Further details of the present invention can be found throughout the present specification and more particularly below.

Figure 3A:
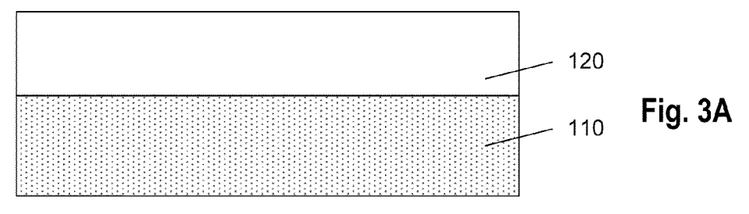
FIG. 3A is a simplified diagram showing a method of forming an insulation layer on a substrate for manufacturing a-Si MAS memory cell structure according to an embodiment of the present invention.

At the process 2100, an insulation layer is formed on a substrate. FIG. 3A shows a simplified method for forming a dielectric layer for manufacturing a semiconductor device having an a-Si MAS memory cell structure according to an embodiment of the present invention. This diagram is merely an example, which should not unduly limit the scope of the claims. One of ordinary skill in the art would recognize many variations, alternatives, and modifications.

As shown in FIG. 3A, a starting substrate 110 is provided. For example, the substrate 110 includes silicon. In another example, the substrate 110 includes a plurality of semiconductor devices including a plurality of CMOS memory devices embedded in inter-layer dielectrics with passivation. On the substrate 110, a first insulation layer 120 is formed. In one embodiment, the first insulation layer 120 includes silicon dioxide. For example, the silicon dioxide is formed by thermal oxidation process. In another example, the silicon dioxide layer is deposited by using high-density plasma chemical vapor deposition (HDP-CVD) technique.

Referring to FIG. 2 at process 2200, one or more n-type a-Si source or drain regions are formed. FIGS. 3B, 3C, 3D, and 3E show a simplified method for forming one n-type a-Si source or drain region for manufacturing a semiconductor device with an a-Si MAS memory cell structure according to an embodiment of the present invention. These diagrams are merely examples, which should not unduly limit the scope of the claims. One of ordinary skill in the art would recognize many variations, alternatives, and modifications. For example, the process 2200 can be implemented to make the device 100.

Figure 3B:
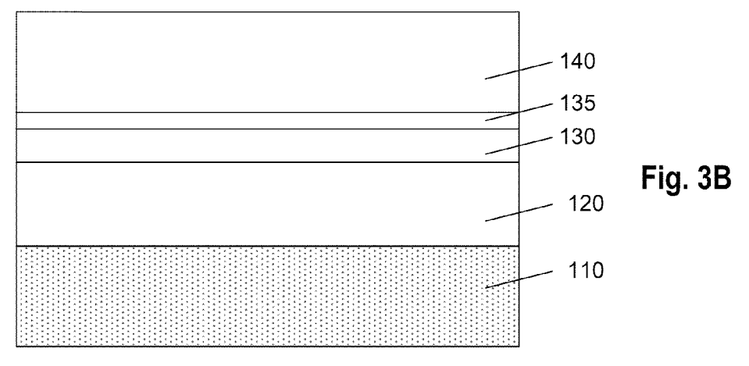
FIG. 3B is a simplified diagram showing a method of forming a conductive layer followed by an n-type a-Si layer for manufacturing a-Si MAS memory cell structure according to an embodiment of the present invention.

As shown in FIG. 3B, on the first insulation layer 120 a conductive layer 130, a diffusion barrier layer 135, and an n-type a-Si layer 140 are formed sequentially. In one embodiment, the conductive layer 130 is made of a metal silicide material. The metal silicide is capable of forming a contact pad for electric coupling. For example, the conductive layer 130 can be electrically coupled with memory array bitlines (not shown) embedded in the first insulation layer 120 along a certain direction. In another example, the conductive layer 130 is titanium silicide ($TiSi_2$). In another embodiment, the $TiSi_2$ layer can be formed by various deposition techniques including evaporation, sputtering or CVD. For example, $TiSi_2$ layer is formed through thermal CVD using gas mixture of $SiH_4$ and $TiCl_4$ etc followed by a thermal annealing at 600-800° C.

In yet another embodiment, to reduce the metal inter-diffusion issue, a diffusion barrier layer 135 is deposited overlying the conductive layer 130 prior the formation of semiconductor layer. For example, the diffusion barrier layer 135 is made of titanium nitride (TiN) material. In another example, TiN layer is deposited with low-pressure chemical vapor deposition (LPCVD) or physical vapor deposition (PVD). Referring again to FIG. 3B, an n-type a-Si layer 140 is formed on the diffusion barrier layer 135. In still another embodiment, the n-type a-Si layer 140 is deposited through a low temperature (<400° C.) plasma-enhanced CVD with flowing of $SiH_4/PH_3/H_2$ gas mixture, wherein phosphorus is the n-type dopant impurity. Other alternative methods such as LPCVD and atomic layer deposition (ALD) techniques can be used to form the n-type a-Si layer 140. Obviously, one of ordinary skill in the art would recognize many other alternatives of the n-type a-Si formation including its dopant.

Figure 3C:
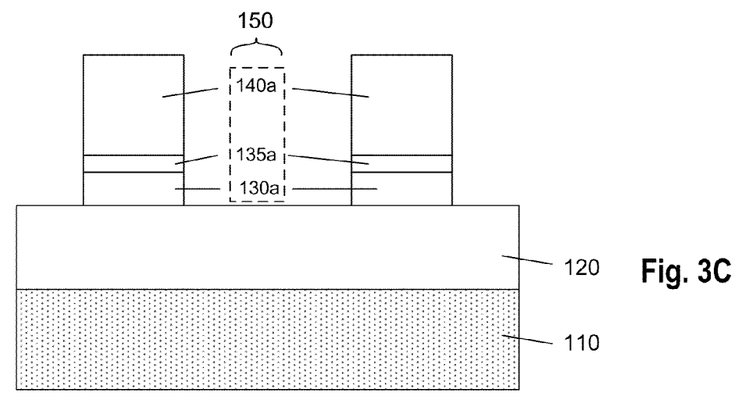
FIG. 3C is a simplified diagram showing a method of forming a source/drain region for manufacturing a-Si MAS memory cell structure according to an embodiment of the present invention.

Still at process 2200, referring to FIG. 3C, according to an embodiment of the present invention, patterning and etching are performed with the sequential layers of 130, 135, and 140. In one embodiment, the patterning is performed with the application of a photoresist layer followed by the UV light exposure under a patterned photo mask. Developing the photoresist layer and strip-cleaning the exposed resist material lead to a surface consisting of partially revealed n-type a-Si layer 140 and one or more confined regions that are still covered by the resist layer. Furthermore, plasma etching is performed to remove the layers of 130, 135, and 140 that are unmasked until the first insulation layer 120 is revealed. The etching process is anisotropic so that the regions covered by the resist layer pattern are remained. After the resist layer is removed, one or more confined regions 150 are formed as shown in FIG. 3C. In one embodiment, each of the one or more confined regions 150 includes confined portions of n-type a-Si layer 140*a*, a diffusion barrier layer 135*a*, and a conductive layer 130*a*. The confined n-type a-Si layer 140*a* is located on the confined diffusion barrier layer 135*a* which overlays the confined conductive layer 130*a*.

Figure 3D:
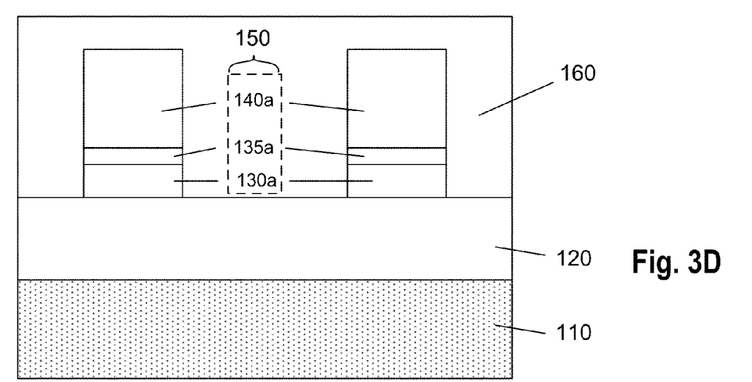
FIG. 3D is a simplified diagram showing a method of forming a dielectric layer to surround the source/drain region for manufacturing a-Si MAS memory cell structure according to an embodiment of the present invention.

Additionally at process 2200, a second insulation layer 160 is added to completely cover the formed one or more confined regions 150 and the exposed area of the first insulation layer 120, as shown in FIG. 3D. In one embodiment, the second insulation layer 160 includes silicon oxide. For example, the silicon oxide is deposited with high-density-plasma (HDP) Chemical Vapor Deposition. In another example, the silicon oxide is tetraethyl orthosilicate TEOS deposited silicon oxide.

Figure 3E:
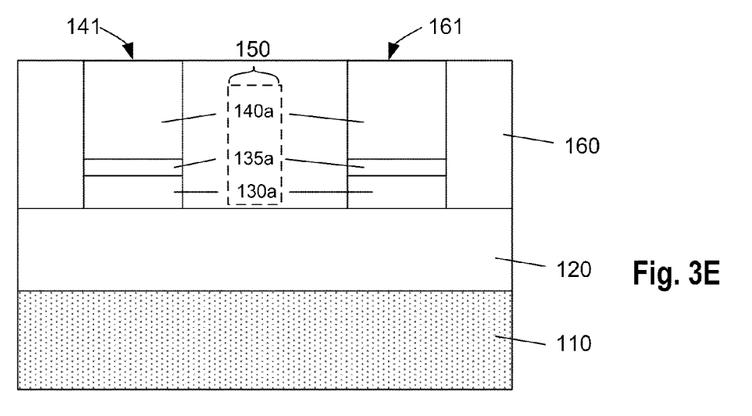
FIG. 3E is a simplified diagram showing a method of forming a leveled surface of the source/drain region and the dielectric layer for manufacturing a-Si MAS memory cell structure according to an embodiment of the present invention.

Referring to FIG. 3E, still at process 2200, a chemical-mechanical planarization (CMP) process is performed to remove extra amount of the second insulation layer 160 until the n-type a-Si layer 140*a* in the confined regions 150 is revealed and a co-planarized surface is formed. The CMP planarized surface includes at least partially the first surface 141 of the n-type a-Si layer in the regions 140*a* and partially the second surface 161 of the second insulation layer 160. In another embodiment, combination of a CMP process and a dry etching process or the dry etching process alone can be used to remove extra amount of the second insulation layer 160. In yet another embodiment of the present invention, the second insulation layer 160 is deposited around the confined regions 150 (as shown in FIG. 3C) until the second surface 161 of the second insulation layer 160 is a substantially co-planar with the first surface 141 of the n-type a-Si in regions 140*a*. The n-type a-Si layer 140*a* within each of the one or more confined regions 150 is embedded in the second insulation layer 150 with a co-planar surface and capable of forming a source or drain region of a memory device. For example, the memory device is the device 100.

Figure 3F:
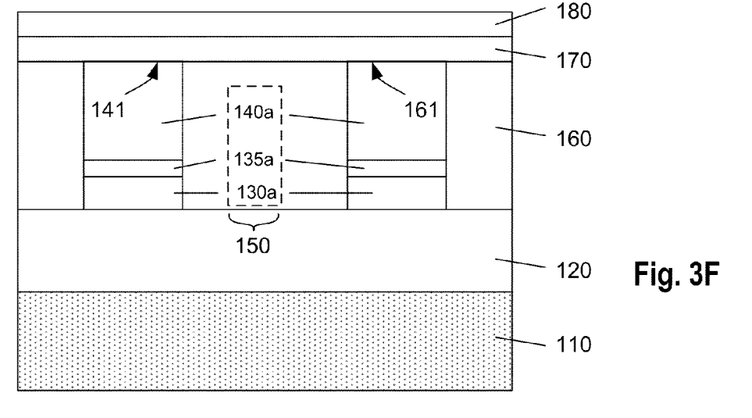
FIG. 3F is a simplified diagram showing a method of forming a p-i-n diode junction for manufacturing a-Si MAS memory cell structure according to an embodiment of the present invention.

Referring back to FIG. 2 at process 2300, a sequential layer of i-type a-Si and p-type a-Si is formed. FIG. 3F shows a simplified method for forming a p-type a-Si layer overlying an i-type a-Si middle layer for manufacturing a semiconductor device having an a-Si MAS memory cell structure according to an embodiment of the present invention. This diagram is merely an example, which should not unduly limit the scope of the claims. One of ordinary skill in the art would recognize many variations, alternatives, and modifications.

As shown in FIG. 3F, an intrinsic or undoped (i.e., the i-type) a-Si layer 170 is formed overlying the surface 141 of the n-type a-Si layer 140a in the confined region 150 and the surface 161 of the second insulation layer 160. In one embodiment, the i-type a-Si layer 170 is at least partially in contact with the surface 141 of the n-type a-Si layer 140a in the confined regions 150. In another embodiment, the i-type a-Si layer 170 is deposited through a low temperature (<400° C.) plasma enhanced CVD with flowing of $SiH_4/H_2$ gas mixture. In another example, the i-type a-Si layer 170 is formed by depositing amorphous silicon using $Si_2H_6$ with LPCVD under 450° C. Other alternative method can be used, such as using $SiH_4$ or $Si_2H_6$ with ALD method.

Additionally at process 2300, a p-type a-Si layer 180 is deposited overlying the i-type a-Si layer 170. For example, the p-type a-Si layer 180 is deposited through a low temperature (<400° C.) plasma-enhanced CVD process with a flowing of $SiH_4/BF_3/H_2$ gas mixture. Other alternative methods such as LPCVD and ALD techniques can be used to form the p-type a-Si layer 180. Of course, one of ordinary skill in the art would recognize many other alternatives of the p-type a-Si formation including its dopant. In one specific embodiment, over the confined n-type a-Si layer 140a there exists a sequential layer of i-type a-Si and p-type a-Si, which is capable of forming an a-Si p-i-n diode junction. The a-Si p-i-n diode junction can be used as an access device for a memory cell. In another specific embodiment, the confined n-type a-Si layer 140a in one of confined region 150 forms a source region and the confined n-type a-Si layer 140a in a neighboring region 150 forms a drain region. Over both of the regions 150 the p-type a-Si layer 180 on the i-type a-Si layer 170 forms a thin-film-transistor channel connecting the n-type source region to the n-type drain region. Such an architecture including an a-Si p-channel thin-film-transistor, according to an embodiment of the invention, can also functions as an access device for a memory cell.

Figure 3G:
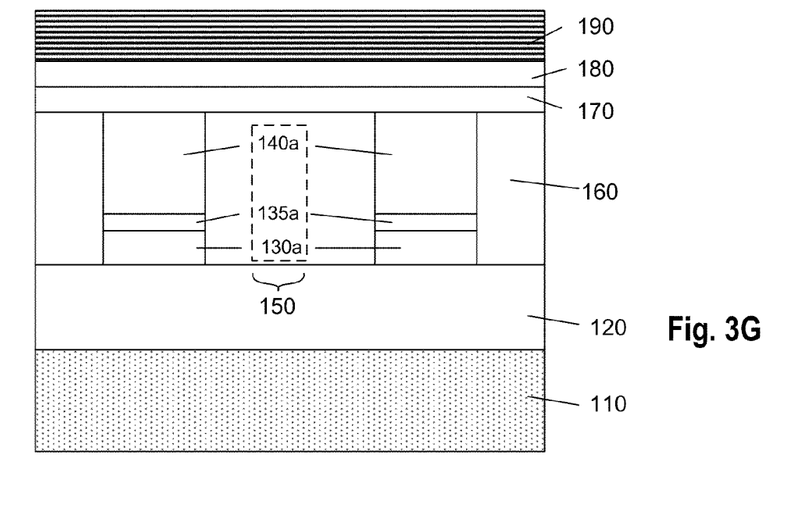
FIG. 3G is a simplified diagram showing a method of forming an aluminum oxide layer for manufacturing a-Si MAS memory cell structure according to an embodiment of the present invention.

Referring again to FIG. 2 at process 2400, an aluminum oxide layer is formed. FIG. 3G shows a simplified method for forming an aluminum oxide layer for manufacturing a semiconductor device having an a-Si MAS memory cell structure according to an embodiment of the present invention. This diagram is merely an example, which should not unduly limit the scope of the claims. One of ordinary skill in the art would recognize many variations, alternatives, and modifications.

Referring to FIG. 3G, an aluminum oxide layer 190 is formed on the p-type a-Si layer 180. In one embodiment, the aluminum oxide layer 190 acts as both a charge trapping dielectric and a blocking or control gate dielectric. In another embodiment, the aluminum oxide layer 190 is deposited using a low-temperature (~100° C.) ALD technique followed by thermal annealing. For example, the aluminum oxide layer 190 is amorphous $Al_2O_3$ when annealed at 400-600° C. in remote plasma activated $N_2O_2$ atmosphere. In certain embodiments, a bottom tunnel barrier layer is added between the aluminum oxide layer 190 and the p-type a-Si layer 180, where the high mobility hot carriers can be injected into the charge trapping aluminum oxide layer 190 from the n-type a-Si drain region 140a by the programming electric field. In one example, the tunnel barrier layer can be silicon dioxide. In another example, the silicon dioxide is formed by atomic-layer-deposition. In yet another embodiment, using aluminum oxide as charge trapping element effectively reduce equivalent total oxide thickness (EOT), thus reducing the access time. As EOT is reduced, the thickness of the tunnel barrier layer can be adjusted to raise the barrier height for achieving a better charge retention time.

Figure 3H:
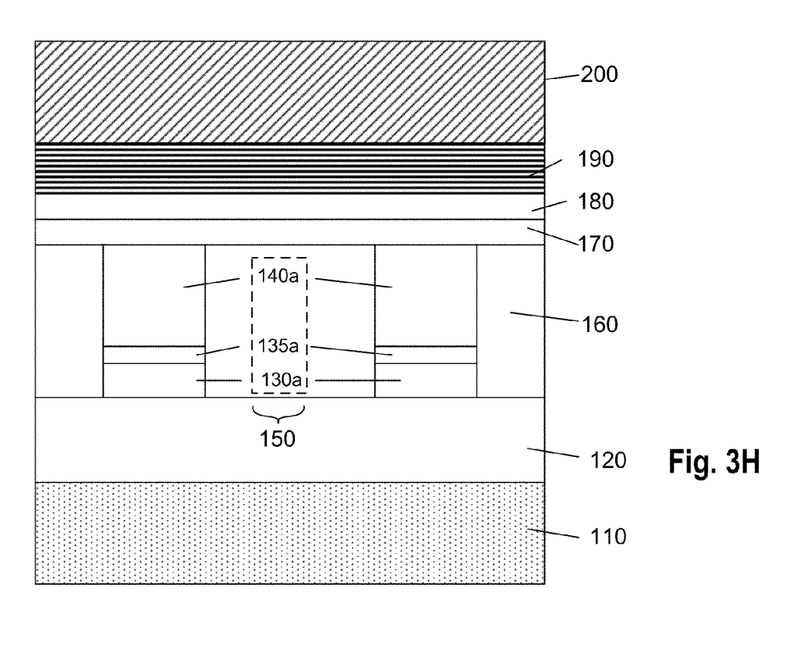
FIG. 3H is a simplified diagram showing a method of forming a metal layer on aluminum oxide layer for manufacturing a-Si MAS memory cell structure according to an embodiment of the present invention.

At process 2500, a metal control gate is formed. FIG. 3H shows a simplified method for forming a metal control gate for manufacturing a semiconductor device having an a-Si MAS memory cell structure according to an embodiment of the present invention. This diagram is merely an example, which should not unduly limit the scope of the claims. One of ordinary skill in the art would recognize many variations, alternatives, and modifications. For example, the process 2500 of the invented method is implemented to make a metal control gate for the device 100.

As shown in FIG. 3H, a metal layer 200 is deposited on top of the Aluminum oxide layer 190. In one embodiment, the metal layer comprises a material with high work function which helps to reduce the memory cell access time when combined with the use of high-k gate dielectric. In one example, the metal layer is aluminum. In another example, the metal layer is titanium. The metal deposition can be performed by various techniques including evaporation, sputtering, electrochemical deposition (ECD) and atomic layer deposition. Alternatively, metal alloy can be used as the gate material. Of course, there are many alternatives, variations, and modifications among the selected materials for the metal layer.

According to an embodiment of the present invention, a control gate can be formed by patterning the metal layer 200 located on the aluminum oxide layer 190 over the a-Si p-i-n diode junction formed at process 2300. In another embodiment, the patterned control gate is positioned over a p-channel TFT formed alternatively at process 2300. In still another embodiment, dual metal gates can be formed within each memory cell. The patterning and etching processes for forming each of the control gate include applying photoresist layer, masking, exposing light, developing resist, striping exposed resist residue, metal etching and resist layer removing, etc.

In another embodiment, each of the patterned control gate can be electrically coupled with memory array wordlines. For example, the memory array wordlines may be configured to be orthogonal to the directions of bitlines of the memory array thereof. Although the detail pattern geometry of the control gate is not explicitly illustrated in FIG. 3H, one of ordinary skilled in the art would recognize many variations, alternatives, and modifications of the gate architectures which should not unduly limit the scope of the claims. At the end of the process 2500, the formation of the control gate completes the formation of the a-Si MAS memory cell structure. For example, arrays of devices 100 are made by the method 2000 including sequential processes from the process 2100 to the process 2500.

Figure 3I:
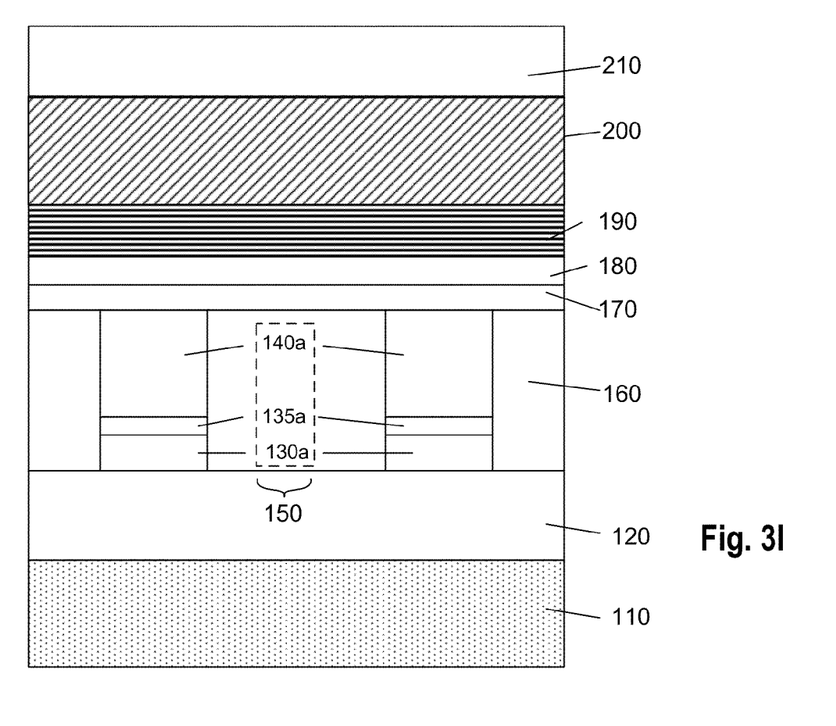
FIG. 3I is a simplified diagram showing a method of forming an inter-layer dielectric layer covering a device having an a-Si MAS memory cell structure according to an embodiment of the present invention.

Referring back to FIG. 2 at process 2600, an inter-layer dielectrics is formed. FIG. 3I shows a simplified method of forming an inter-layer dielectrics 210 covering a device with a-Si MAS memory cell structure formed at the end of the process 2500. This diagram is merely an example, which should not unduly limit the scope of the claims. One of ordinary skill in the art would recognize many variations, alternatives, and modifications. For example, a plurality of devices with a-Si MAS memory cell structure can be formed at the end of the process 2500 prior to the formation of the inter-layer dielectrics 210. Additionally, metal interconnects (not shown) can be embedded in the inter-layer dielectrics 210 for coupling to either bitlines or wordlines of the memory arrays. In another specific embodiment, the a-Si MAS memory cell structure formed though process 2100 to 2600 is three-dimensional stackable. For example, the inter-layer dielectrics may be planarized by a CMP or an etch back process The planarized surface of the dielectrics can be used as a substrate. Then the sequence of processes (2100 through 2500) of the method 2000 can be repeated to form another layer of memory cell arrays.

As shown in FIG. 3I, in a specific embodiment, the invention provides a device with a-Si MAS memory cell structure. The device includes a substrate, a dielectric layer on the substrate, and one or more source or drain regions being embedded in the dielectric layer. Each of the one or more source or drain regions includes an n-type a-Si layer, a diffusion barrier layer, and a conductive layer. The n-type a-Si layer, which has a co-planar surface with the dielectric layer, is located on the diffusion barrier layer. The diffusion barrier layer overlays the conductive layer. Additionally, the device includes an intrinsic type (i-type) a-Si layer overlying the co-planar surface of the n-type a-Si layer and the dielectric layer. Moreover, the device includes a p-type a-Si layer overlying the i-type a-Si layer. The device further includes an aluminum oxide layer on the p-type a-Si layer and at least one control gate overlying the aluminum layer.

The processes described above for manufacturing a semiconductor device having an a-Si MAS memory cell structure are merely examples which should not unduly limit the scope of the claims herein. There can be many alternatives, modifications, and variations for an ordinary skill in the art. For example, some of the processes may be expanded and/or combined. Other processes may be inserted to those mentioned above. According to a specific embodiment, the method 2000 straightforwardly provides a two-dimensional array of memory cells having the same structure of device 100. According to another specific embodiment, the method 2000 can be repeated to stack the cell structure in multi-layers, so that a three-dimensional arrays of memory cell structure can be manufactured. The simplicity of the formation of n-type a-Si source/drain regions, the p-i-n junction or the n-p-n a-Si TFT, and aluminum oxide charge trapping layer followed by a metal gate, which is fully compatible with established CMOS technology, provides intrinsic advantage for 3D stacking. For example, the device 100 having a-Si MAS memory cell structure can be embedded in larger chips three-dimensionally with high packing density and reduced scaling limits.

The present invention has various advantages. Some embodiments of the present invention provide a new MAS memory cell that is capable for 3D stacking integration. Certain embodiments of the present invention provide an a-Si p-i-n junction in the memory cell as the memory access device. For example, p-i-n a-Si diode junction is formed with low temperature (<450° C.) CVD process which meets the stackability and thermal budget constraints for the 3D memory cells. Some embodiments of the present invention can reduce access time and improve the charge retention time for the memory cell. Certain embodiments of the present invention provide a simple method for manufacturing 3D memory cells using processes that are compatible with established CMOS technology.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing an amorphous silicon (a-Si) metal aluminum oxide semiconductor (MAS) memory cell structure, the method comprising:

providing a substrate;
forming a first insulation layer on the substrate;
forming one or more source or drain regions on the first insulation layer, each of the one or more source or drain regions being associated with a first surface and including an n-type a-Si layer, a barrier layer, and a conductive layer, the n-type a-Si layer being on the barrier layer, the barrier layer overlying the conductive layer, the first surface being associated with the n-type a-Si layer;
forming a second insulation layer on the first insulation layer, the second insulation layer being associated with a second surface, the second surface being substantially co-planar with the first surface;
forming an i-type a-Si layer overlying the first surface and the second surface;
forming a p-type a-Si layer overlying the i-type a-Si layer;
forming an aluminum oxide layer on the p-type a-Si layer;
forming a metal layer overlying the aluminum oxide layer; and
forming one or more control gates by patterning the metal layer.

2. The method of claim 1 wherein the method of forming one or more source or drain regions on the first insulation layer further comprises:
forming a conductive layer overlying the first dielectric layer;
forming a barrier layer overlying the conductive layer;
forming a n-type a-Si overlying the barrier layer; and
patterning the n-type a-Si layer plus the barrier layer and the conductive layer to form a confined region including the first surface.

3. The method of claim 2 wherein the conductive layer is metal-silicide comprising $TiSi_2$.

4. The method of claim 2 wherein the barrier layer is metal-nitride comprising TiN.

5. The method of claim 1 wherein the first dielectric layer comprises silicon dioxide.

6. The method of claim 1 wherein the second dielectric layer comprises silicon oxide.

7. The method of claim 1 wherein forming a second insulation layer on the first insulation layer further comprises:
depositing the second insulation layer to cover one or more source or drain regions on the first insulation layer; and
performing CMP and/or etch back process so as to form the second surface, the second surface being substantially co-planar with the first surface.

8. The method of claim 7 wherein the method of depositing the silicon oxide layer includes high-density-plasma-assisted chemical vapor deposition.

9. The method of claim 7 wherein the method of depositing the silicon oxide layer includes TEOS silicon oxide deposition.

10. The method of claim 1 wherein the p-type a-Si layer overlying the i-type a-Si layer is capable of forming an amorphous silicon PIN diode junction at the first surface.

11. The method of claim 1 wherein the p-type a-Si layer overlying the i-type a-Si layer is capable of forming a p-channel connecting the n-type a-Si source region and the n-type a-Si drain region.

12. The method of claim 1 wherein forming amorphous silicon layer further comprises depositing amorphous silicon by $Si_2H_6$ with low pressure chemical vapor deposition (LP-CVD) method under 450 Degree Celsius or by $SiH_4$ with plasma CVD or by $SiH_4$ or $Si_2H_6$ with atomic layer deposition (ALD) method.

13. The method of claim 1 wherein the aluminum oxide layer comprises atomic-layer-deposited $Al_2O_3$.

14. The method of claim 1 wherein the metal layer overlying the aluminum oxide layer comprises aluminum material.

15. The method of claim 1 wherein the metal layer overlying the aluminum oxide layer comprises titanium material.

16. The method of claim 1 where each control gate is positioned over at least one source region and one drain region.

17. The method of claim 1 further comprising repeating the process steps to form three-dimensional memory cell structures.

18. A method of manufacturing an amorphous silicon (a-Si) metal aluminum oxide semiconductor (MAS) memory cell structure, the method comprising:
provic a substrate;
forming a first insulation layer on the substrate;
forming one or more source or drain regions on the first insulation layer, each of the one or more source or drain regions being associated with a first surface and including an n-type a-Si layer, a barrier layer, and a conductive layer, the n-type a-Si layer being on the barrier layer, the barrier layer overlying the conductive layer, the first surface being associated with the n-type a-Si layer;
forming a second insulation layer on the first insulation layer, the second insulation layer being associated with a second surface, the second surface being substantially co-planar with the first surface;
forming an i-type a-Si layer overlying the first surface and the second surface;
forming a p-type a-Si layer overlying the i-type a-Si layer;
forming an aluminum oxide layer on the p-type a-Si layer;
forming a metal layer overlying the aluminum oxide layer;
forming one or more control gates by patterning the metal layer; and
forming a tunnel dielectric barrier between the p-type a-Si layer and the aluminum oxide layer.

19. The method of claim 18 wherein the aluminum oxide layer is capable of trapping charges tunneled through the dielectric barrier for memory storage.

* * * * *